United States Patent [19]
Imaizumi et al.

[11] Patent Number: 5,194,866
[45] Date of Patent: Mar. 16, 1993

[54] HALF-FLASH ANALOG-TO-DIGITAL CONVERTER USING DIFFERENTIAL COMPARATORS AND CROSSOVER SWITCHING

[75] Inventors: Eiki Imaizumi, Akishima; Kunihiko Usui, Asaka; Tatsuji Matsuura, Kokubunji, all of Japan

[73] Assignees: Hitachi, Ltd., Tokyo; Hitachi VLSI Engineering Corporation, Kodaira, both of Japan

[21] Appl. No.: 793,574

[22] Filed: Nov. 18, 1991

[30] Foreign Application Priority Data

Nov. 16, 1990 [JP] Japan .................................. 2-308737
Nov. 12, 1991 [JP] Japan .................................. 3-295458

[51] Int. Cl.$^5$ .............................................. H03M 1/14
[52] U.S. Cl. .............................................. 341/156
[58] Field of Search ................................... 341/156

[56] References Cited

U.S. PATENT DOCUMENTS 4,903,028 2/1990 Fukushima ........................ 341/156
5,072,220 12/1991 Petsehacher et al. ............. 341/156
5,099,240 3/1992 Nakatani et al. .................. 341/156

Primary Examiner—Howard L. Williams
Attorney, Agent, or Firm—Antonelli, Terry, Stout & Kraus

[57] ABSTRACT

A resistor-string divided into plural sets of unit-resistors generates plural reference voltages for the upper bits, while each divided set generates plural reference voltages for the lower bits. A first and second differential input are generated in direct and inverse proportion to the analog input voltage. Differential comparators for the upper bits compare two differential voltages from between the two reference voltages and the first and second differential input votlages. Two of the divided sets are selected according to the upper bit digital value and one reference voltage from each selected set is switched to a differential comparator for the lower order bits. Lower order bit comparison is similar to the high order comparison described above. Final digital value is obtained by linking the upper and lower bits digital value.

12 Claims, 8 Drawing Sheets

HALF-FLASH ANALOG-TO-DIGITAL CONVERTER USING DIFFERENTIAL COMPARATORS AND CROSSOVER SWITCHING

BACKGROUND OF THE INVENTION

The present invention relates to an analog-to-digital (hereinafter referred to as "A/D") converter, particularly the high-speed and high-precision A/D converter which is suited for use in integrated circuits.

The A/D converter related to the present invention is described in Japanese Patent Application Laid-Open No. 5623026.

The structure of a 4-bit half-flash A/D converter using the aforementioned conventional technology is shown in FIG. 9. This A/D converter is comprised of a resistor-string 11 which is connected between constant voltage sources $V_{RT}$ and $V_{RB}$ (In this specification, the voltage values of these voltage sources are also shown as $V_{RT}$ and $V_{RB}$. Voltage $V_{RT}$ is greater than $V_{RB}$.), voltage comparators for upper bits 16, 17 and 18 which use the partial voltages that were taken out from the position where this resistor-string 11 was divided into four sets as reference voltages and compare them with input signal $V_i$ a selector and an encoder 5 which output digital value by using this output from the comparators 16–18 as input while outputting a signal for selecting a set of reference voltage obtained from the resistor-string that has been divided into four sets, selection switches 91, 92, 93, 94 which take out partial voltages from a set of resistor-string that has been selected, voltage comparators for lower bits 21, 22 and 23 which use the partial voltages that were taken out via these selection switches 91–94 as reference voltages and compare them with input signal $V_i$, an encoder 6 which outputs digital value of lower bits from the output of voltage comparators 21–23, and an output circuit 10 which combines the outputs of a selector encoder 5 and an encoder 6 and outputs 4 bit digital value.

SUMMARY OF THE INVENTION

The aforementioned A/D converter using conventional technology is prone to cause comparation errors when various noises are mixed in the reference voltage or input signal because each voltage with comparator is a comparator that compares a reference voltage an input signal. As a result, there was a particular problem of a tendency of missing code and deterioration of linearity occurring on the input signal level where upper bits are transformed.

The object of the present invention is to solve the aforementioned problem of conventional technology and offer an A/D converter which is less affected by noise and suited for use in integrated circuits.

To accomplish the aforementioned objective, the present invention uses as voltage comparator a fully-differential voltage comparator for comparing differential voltage $\Delta V_r (= V_{rh} - V_{rl})$ of reference voltages $V_{rh}$ and $V_{rl}$ with differential voltage $\Delta V_i (= V_{ih} - V_{il})$ of input signals $V_{ih}$ and $V_{il}$ which correspond to input signal $V_i$. In addition, the present invention shall have a structure in which differential reference voltages $V_{rh}$ and $V_{rl}$ or differential input signals $V_{ih}$ and $V_{il}$ are switched according to the value of upper bits when performing A/D conversion of lower bits and input into fully-differential voltage comparator for lower bits.

Comparison errors were eliminated even when common mode noises are mixed in a reference voltage or input signal by using fully-differential voltage comparator for voltage comparator, while increase in circuit scale owing to the use of fully-differential voltage comparator for voltage comparator was avoided by adopting a structure in which lower bits are obtained by inputting reference voltage or input signal into voltage comparators for lower bits by switching them according to the digital value of upper bits. As a result, a half-flash A/D converter which is less affected by noise, has high precision and is suited for integrated circuit is realized.

DETAILED DESCRIPTION OF EMBODIMENTS

Figure 1:
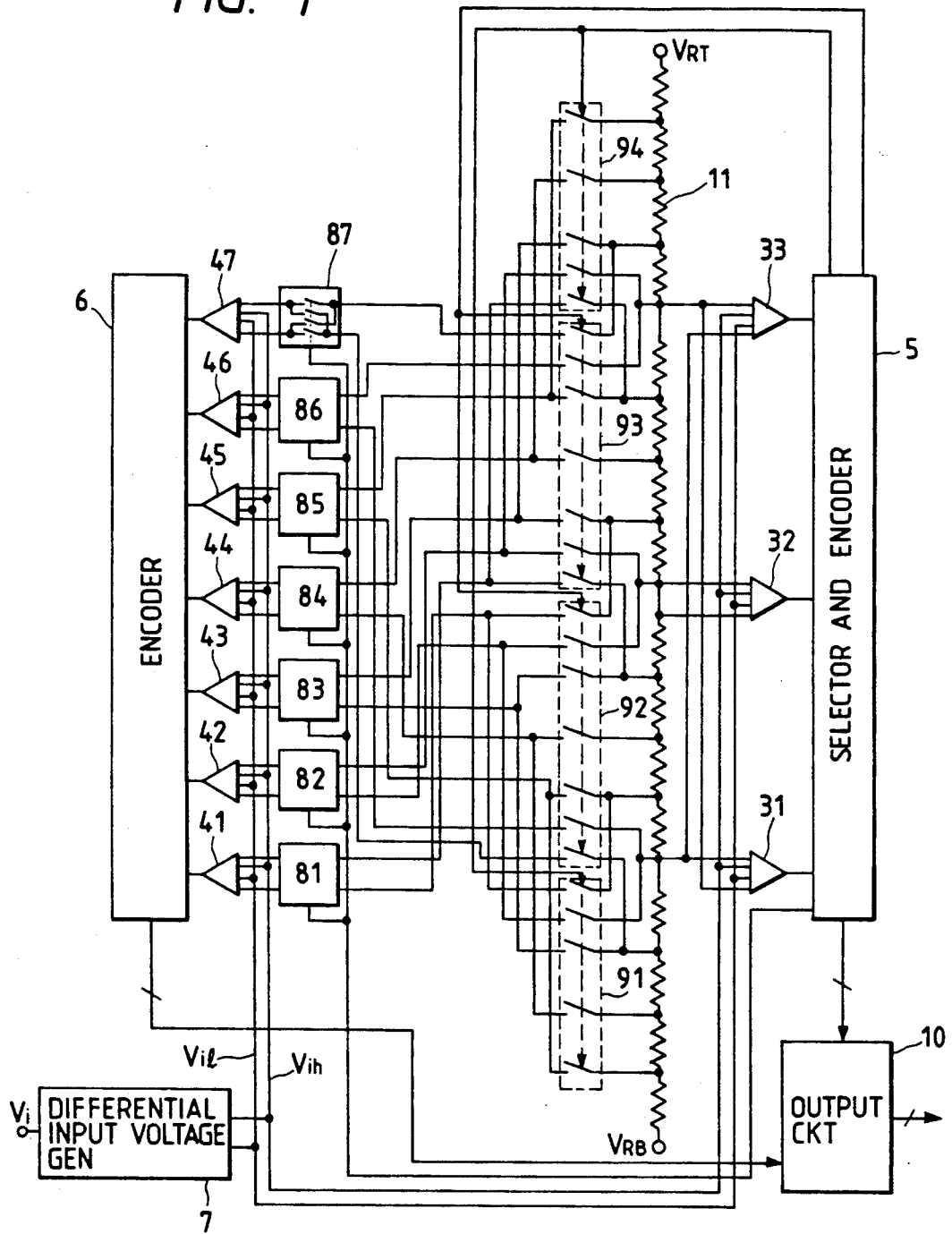
FIG. 1 is a circuit diagram of an embodiment of the present invention.

An embodiment of the present invention will be explained by using FIG. 1 through FIG. 4. FIG. 1 is a circuit structure diagram of the embodiment of the present invention and illustrates an example of a 4-bit half-flash A/D converter with upper two bits and lower 2 bits.

Figure 2:
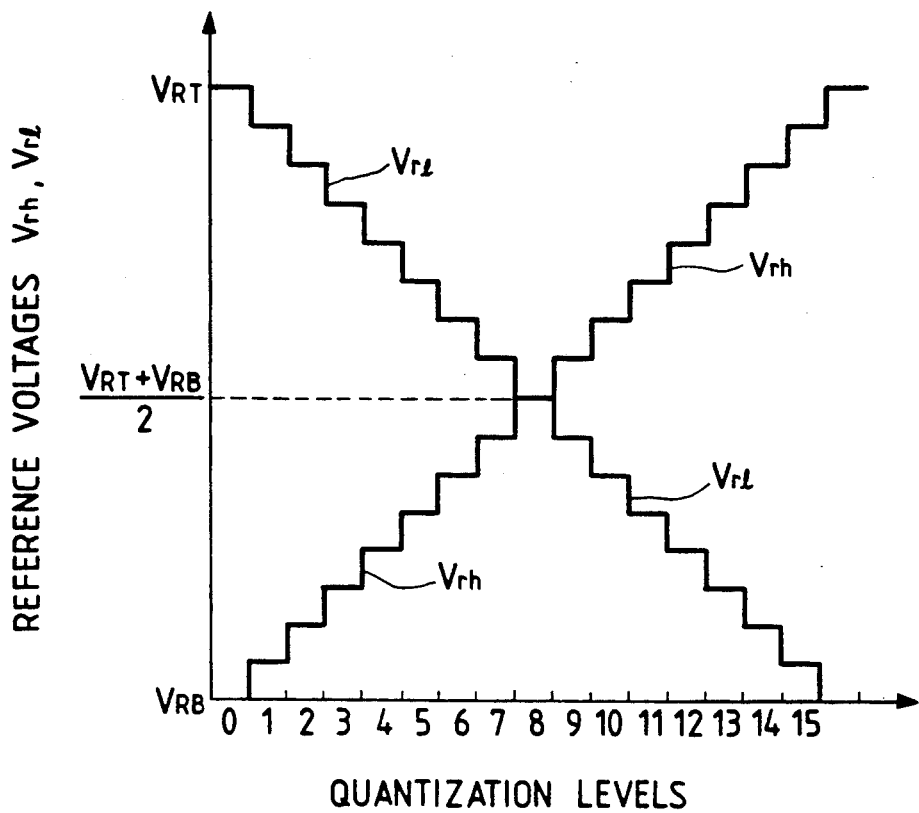
FIG. 2 is a graph showing an example of reference voltages $V_{rh}$ and $V_{rl}$ which are used in the circuit in FIG. 1.

The A/D converter of the present embodiment shown in FIG. 1 includes a resistor-string 11 (resistor-string 11 is comprised of serial connection of 16 unit resistors of the same value) which is connected between constant voltage sources $V_{RT}$ and $V_{RB}$ (voltage $V_{RT}$ is greater than voltage $V_{RB}$) and generates the reference voltages $V_{rh}$ and $V_{rl}$ shown in FIG. 2, a differential input voltage generation circuit 7 which creates differential input voltages $V_{ih}$ and $V_{il}$ which correspond to an analog input signal $V_i$, three fully-differential voltage comparators for upper bits 31, 32 and 33 each of which uses the partial voltages at the positions where resistors forming resistor-string 11 are divided into four sets so that there will be four resistors in each set as reference voltages $V_{rh}$ and $V_{rl}$ and compares its differential voltage $\Delta V_r (= V_{rh} - V_{rl})$ with differential voltage $\Delta V_i (= V_{ih} - V_{il})$ of differential input voltage, a selector encoder 5 which outputs 2 bit digital value (for upper bits) by using the output from the comparators 31–33 as input and outputs a signal for selecting two sets of reference voltage groups (in this embodiment, they shall be two sets of reference voltage groups with overlap equivalent to 2LSB) from resistor-string 11 that has been divided into four sets according to the digital value, selection switches 91, 92, 93 and 94 which selectively derive two sets of reference voltage group to be selected from resistor-string 11, reference voltage interchanging switches 81, 82, 83, 84, 85, 86, and 87 each of which switches one of the two sets of reference voltage group that has been derived via the switches 91 and 94 or 92 and 93 into a reference voltage group for reference voltage $V_{rh}$ and the other into a reference voltage group for reference voltage $V_{rl}$ according to the digital value of upper bits, seven fully-differential voltage comparators for lower bits 41, 42, 43, 44, 45, 46 and 47 (of the seven comparators, the three at the center, 43, 44 and 45 are for lower 2 bits while the upper two, 46 and 47, and the lower two, 41 and 42, correspond to the overlapped portion of reference voltage) each of which compares differential voltage $\Delta V_i (= V_{ih} - V_{il})$ of differential input voltages $V_{ih}$ and $V_{il}$ which is output from differential input voltage generation circuit 7 with differential voltage $\Delta V_r (= V_{rh} - V_{rl})$ of reference voltages $V_{rh}$ and $V_{rl}$ which are output via each of the interchanging switches, an encoder 6 which outputs 2 bit digital value for lower bits according to the outputs of the comparators 43-45 and outputs a signal for correcting upper 2 bit digital values according to the outputs of the comparators 41, 42, 46 and 47, and an output circuit 10 which determines and outputs the final digital value from the outputs of the selector encoder 5 and the encoder 6.

FIG. 2 is a diagram showing reference voltages $V_{rh}$ and $V_{rl}$ which are obtained as partial voltages of the resistor-string 11. The reference voltages $V_{rh}$ and $V_{rl}$ which ascends and descends step-wise as partial voltages on 16 serially-connected unit resistors, respectively, can be obtained by connecting both ends of the resistor-string 11 comprised from serial connection of 16 unit resistors to voltage sources $V_{RT}$ and $V_{RB}$.

Figure 3A:
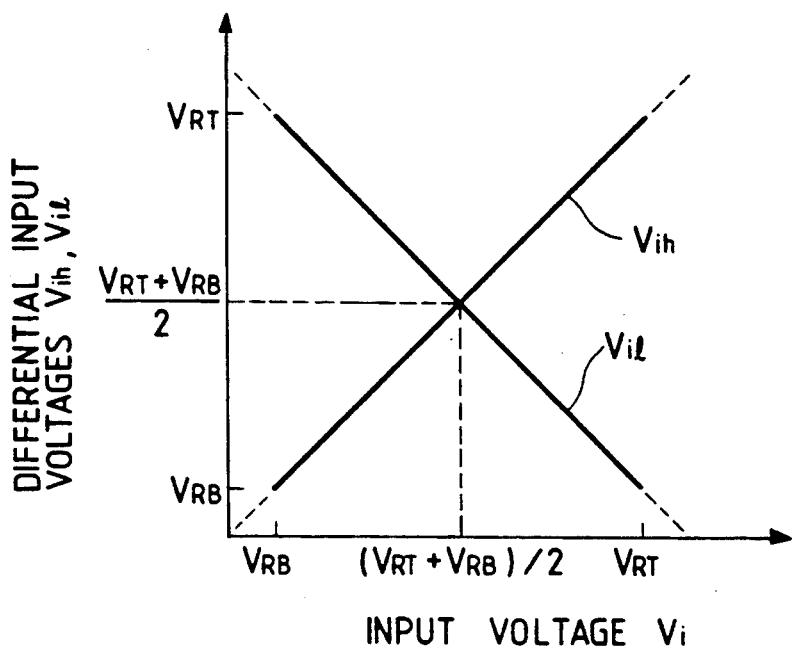
FIG. 3A is a graph showing an example of the input and output characteristics of differential input voltage generation circuit which is used in the circuit in FIG. 1.

FIG. 3A is a diagram showing an example of input and output characteristics of the differential input voltage generation circuit 7 in FIG. 1. It is set up in such a way that, $V_{ih}$, which is one of the two differential input voltages, increases in proportion to the increase in input voltage $V_i$ while the other differential input voltage $V_{il}$ decreases in inverse proportion to the increase in input voltage $V_i$. In addition, $V_{ih}$ becomes equal to $V_{RB}$ and $V_{il}$ becomes equal to $V_{RT}$ when input voltage $V_i$ is equal to reference voltage $V_{RB}$, and $V_{ih}$ becomes equal to $V_{RT}$ and $V_{il}$ becomes equal to $V_{RB}$ when input voltage $V_i$ is equal to reference voltage $V_{RT}$.

Figure 3B:
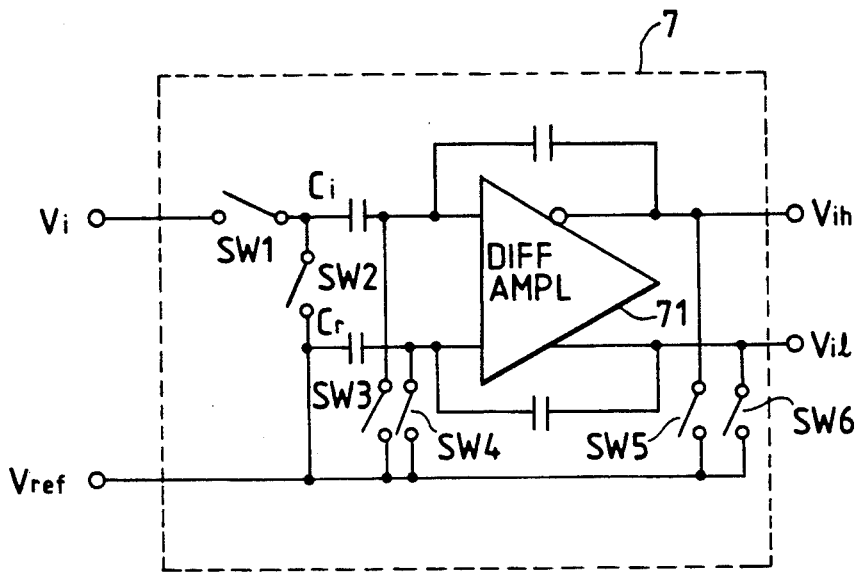
FIG. 3B is a graph showing an actual example of the differential input voltage generation circuit which is used in the circuit in FIG. 1.
Figure 3C:
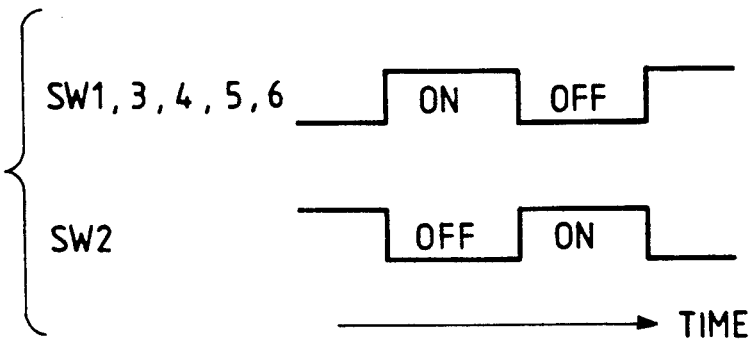
FIG. 3C is a timing chart which shows the on and off status of switches for the circuit in FIG. 3B.

FIG. 3B is a circuit diagram illustrating an example of the differential input voltage generation circuit 7 while FIG. 3C is a timing chart which shows the on and off status of switches for the circuit in FIG. 3B. In these diagrams, $V_i$ designates an analog input voltage, $V_{ref}$ a predetermined reference voltage and 71 a differential amplifier. At first, the input voltage $V_i$ is sampled and held at a capacitor $C_i$ by closing switches SW1, SW3, SW4, SW5 and SW6, i.e. electric charges according to the input voltage $V_i$ are accumulated in the capacitor $C_i$. Then the switches SW1, SW3, SW4, SW5 and SW6 are opened while closing a switch SW2 which distributes the electric charges accumulated in the capacitor $C_i$ to a capacitor $C_r$ after passing through the switch SW2. At this time, the output voltages $V_{ih}$ and $V_{il}$ from the differential amplifier 71 change in such a way that equal amount of electric charges are accumulated in both the capacitors $C_i$ and $C_r$. Accordingly, the differential input voltages $V_{ih}$ and $V_{il}$ as shown in FIG. 3A is obtained as output voltages $V_{ih}$ and $V_{il}$ from the differential amplifier 71.

Figure 9:
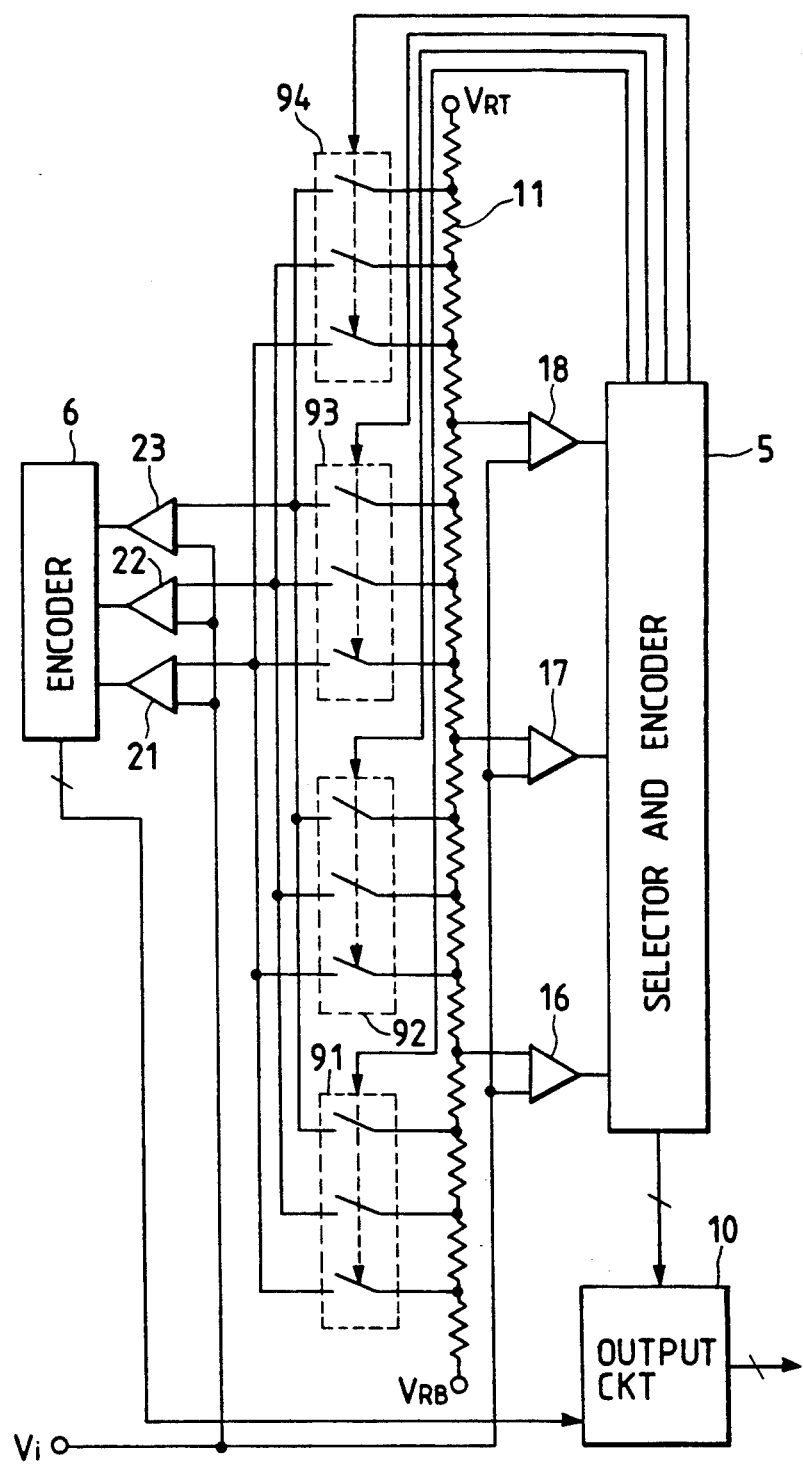
FIG. 9 is a circuit diagram for a conventional A/D converter.

The fully-differential voltage comparators 31-33 and 41-47 each have a pair of reference voltage input terminals to which a pair of reference voltages $V_{rh}$ and $V_{rl}$ are supplied and a pair of signal input terminals to which a pair of differential input voltages $V_{ih}$ and $V_{il}$ are supplied, and compare differential voltage $\Delta V_r$ ($= V_{rh} - V_{rl}$) between a pair of a reference voltages $V_{rh}$ and $V_{rl}$ with differential voltage $\Delta V_i$ ($= V_{ih} - V_{il}$) between a pair of reference voltages $V_{ih}$ and $V_{il}$. A fully-differential voltage comparator of this type has been mentioned, for instance, in Stephen H. Lewis et al., "A Pipeline 5-Msample/s 9-bit Analog-to-Digital Converter", IEEE Journal of Solid-State Circuits, Vol. SC-22, No. 6, December 1987, pp. 954-961. Please refer to FIG. 9 and FIG. 10 of this paper as well as their explanations.

Figure 4:
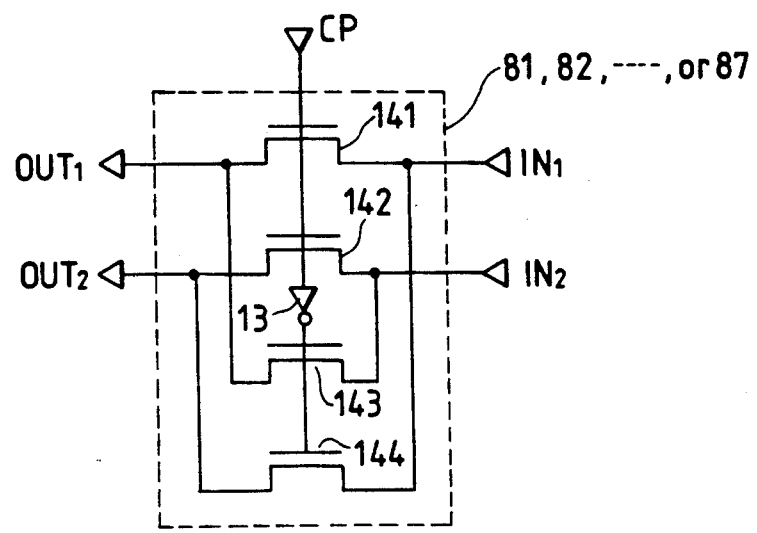
FIG. 4 is a circuit diagram showing an example of reference voltage interchanging switch which is used in the circuit in FIG. 1.

Moreover, FIG. 4 is a circuit diagram which shows an example of a circuit which comprises each of the reference voltage interchanging switches 81-87 in FIG. 1. In this diagram, an interchanging switch is comprised of N channel type MOS transistors 141, 142, 143 and 144 and an inverter 13. An input terminal IN$_1$ is connected to an output terminal OUT$_1$ and an input IN$_2$ to an output terminal OUT$_2$ when a pulse signal CP is at a high level, while the input terminal IN$_1$ is connected to the output terminal OUT$_2$ and the input IN$_2$ to the output terminal OUT$_1$ when the pulse signal CP is at a low level.

Going back to FIG. 1, in the A/D converter in the present embodiment, partial voltages at the positions where the resistor-string 11 is divided into four sets are regarded as reference voltages for upper bits $V_{rh}$ and $V_{rl}$, and voltages are compared with input voltages $V_{ih}$ and $V_{il}$ by using fully-differential voltage comparators for upper bits 31-33 to perform A/D conversion for upper bits. Two sets of reference voltage groups are selected from this result, using reference voltages $V_{rh}$ and $V_{rl}$ that are obtained as partial voltages inside the selected two sets of reference voltage groups as reference voltages for lower bits. There are then compared with input voltages $V_{ih}$ and $V_{il}$ by using the fully-differential voltage comparators for lower bits 43-45, obtaining the A/D conversion value for lower bits from the result of this comparison. At the same time, the signal for correcting upper bit digital values according to the outputs of the comparators 41, 42, 46 and 47 is also obtained. The A/D conversion value for lower bits and the correction signal for upper bits are supplied from the encoder 6 to the output circuit 10. Finally, the output circuit 10 links the lower A/D conversion value with the upper A/D conversion value, and either correct upper bit digital values according to the upper bit correction signal which was obtained during lower comparison or creates the final A/D conversion value if correction is not necessary. This value is output as A/D conversion value of the input signal $V_i$.

When the two sets of reference voltages selected by selector and encoder 5 are to be input to the fully-differential voltage comparators for lower bits 43-45 and to the fully-differential voltage comparators for upper bit correction signal 41, 42, 46 and 47, the reference voltage interchanging switches 81-87 switch the selected reference voltage to $V_{rh}$ or to $V_{rl}$ depending on the result of upper bit A/D conversion. In other words, in the even these interchanging switches 81-87 are not installed, the circuit scale will expand as it becomes necessary to install, in addition to these comparators 41-47, seven more fully-differential voltage comparators for lower bits and upper bit correction signal where reference voltages $V_{rh}$ and $V_{rl}$ are interchanged before they are input. Installing the reference voltage interchanging switches 81-87, however, can reduce the number of fully-differential voltage comparators for lower bits and for upper bit correction signal by about one half.

In this embodiment, total of seven comparators, including three voltage comparators 43-45 at the center for A/D conversion of lower bits, and two voltage comparators 41 and 42, 46 and 47, below and above them, are installed. Then selection switches 91 and 94, 92 and 93 take out respective partial voltages from the two sets of reference voltage groups selected from the resister-string that are divided into four sets according to the digital value of upper bits so that they can be applied as reference voltages $V_{rh}$ and $V_{rl}$ to the three voltage comparators 43-45 at the center, while taking out partial voltages inside reference voltage groups adjoining to the aforementioned two sets of reference voltage groups that have been selected so that they can be applied to the two voltage comparators 41, 42 and the two voltage comparators 46, 47 as reference voltages $V_{rh}$ and $V_{rl}$ thereby correcting conversion errors in voltage comparators for upper bits 31-33 according to the result of comparison at these additional voltage comparators 41, 42, 46 and 47.

Figure 5:
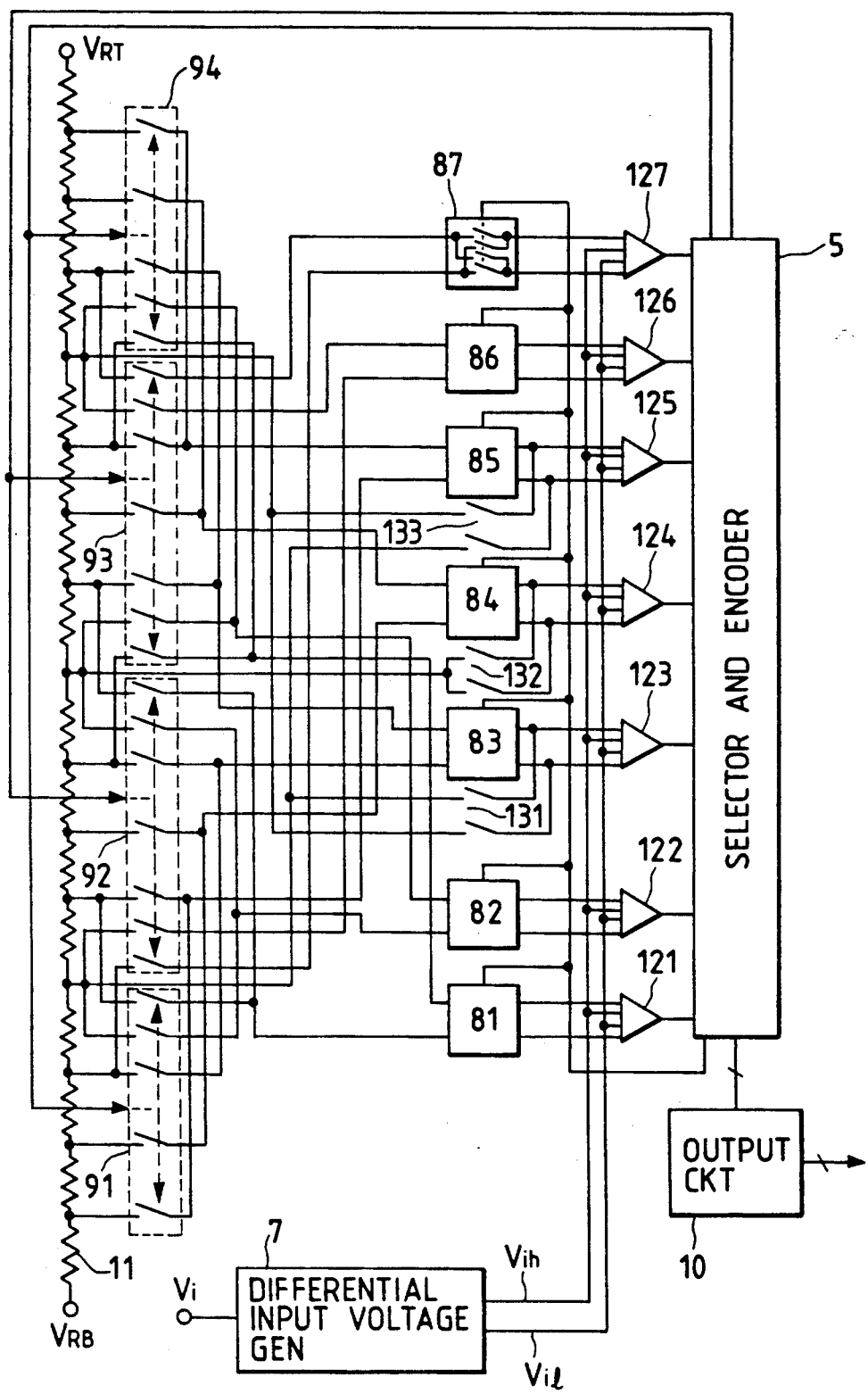
FIGS. 5, 6, 7 and 8 are circuit diagrams which respectively show different embodiments of the present invention.

FIG. 5 is a structural diagram of other embodiment of the present invention. The difference between this and the embodiment in FIG. 1 is that, while the fully-differential voltage comparators for upper bits 31-33 and the fully-differential voltage comparators for lower bits 43-45 are installed individually in FIG. 1, fully-differential voltage comparators 123, 124 and 125 which serve both upper bits and lower bits are used in this embodiment shown in FIG. 5.

An A/D converter in this embodiment first closes changing switches 131, 132 and 133, performs A/D conversion of upper bits by using partial voltages generated from a resistor-string 11 as reference voltages, and then performs A/D conversion by having two sets of reference voltage groups selected from the resistor-string 11 selected by selection switches 91 and 94, and 92 and 93 according to the result of A/D conversion of upper bits, and re-inputting partial voltages from the selected reference voltage groups into fully-differential voltage comparators 123-125 via reference voltage interchanging switches 83-85. The changing switches 131-133 shall be opened at this time. Fully-differential voltage comparators 121, 122, 126 and 127 are for upper bit correction signal that have the same operation as the comparators 41, 42, 46 and 47 in FIG. 1. According to this embodiment, circuit scale can be reduced by one half compared to installing separate fully-differential voltage comparators for upper bits and lower bits, by installing a fully-differential voltage comparator which serves both. In this embodiment, however, conversion speed is reduced by over one half as a result of using a voltage comparator for both upper and lower bits.

Figure 6:
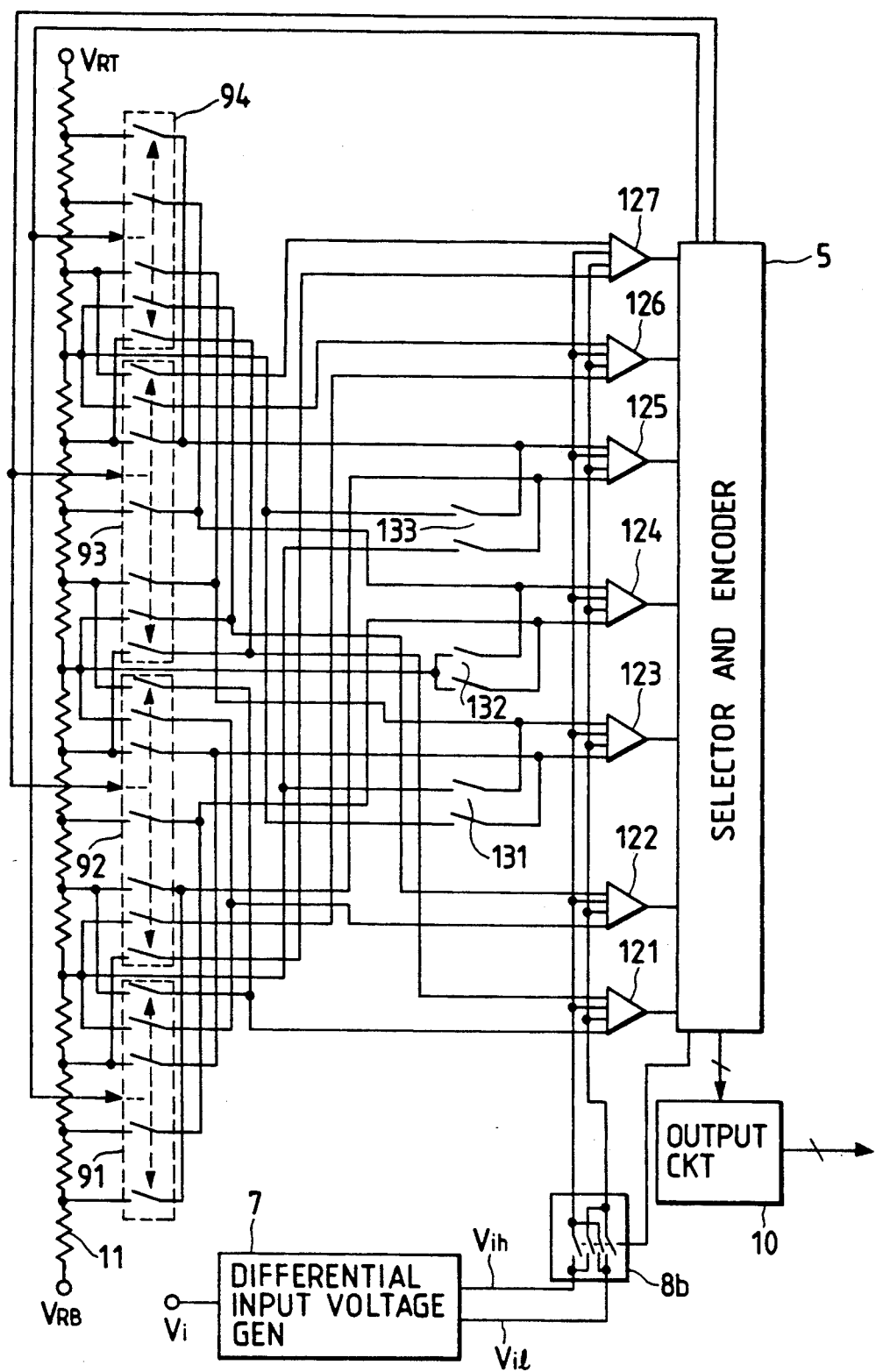

FIG. 6 is a structural diagram which illustrates another embodiment of the present invention. The difference with the embodiment in FIG. 5 is that, while reference voltage interchanging switches for interchanging reference voltages $V_{rh}$ and $V_{rl}$ were installed in each of the seven fully-differential voltage comparators 121-127 in FIG. 5, a differential input voltage interchanging switch 8b for interchanging two input voltages $V_{ih}$ and $V_{il}$ from differential input voltage generation circuit 7 according to the result of A/D conversion of upper bits is installed instead in this embodiment. As a result, circuit scale can be reduced further as one differential input voltage interchanging switch 8b can replace seven reference voltage interchanging switches 81-87. Incidentally, as for the actual circuit structure of 8b, the exact same reference voltage interchanging switch as shown in FIG. 4 can be used.

Figure 7:
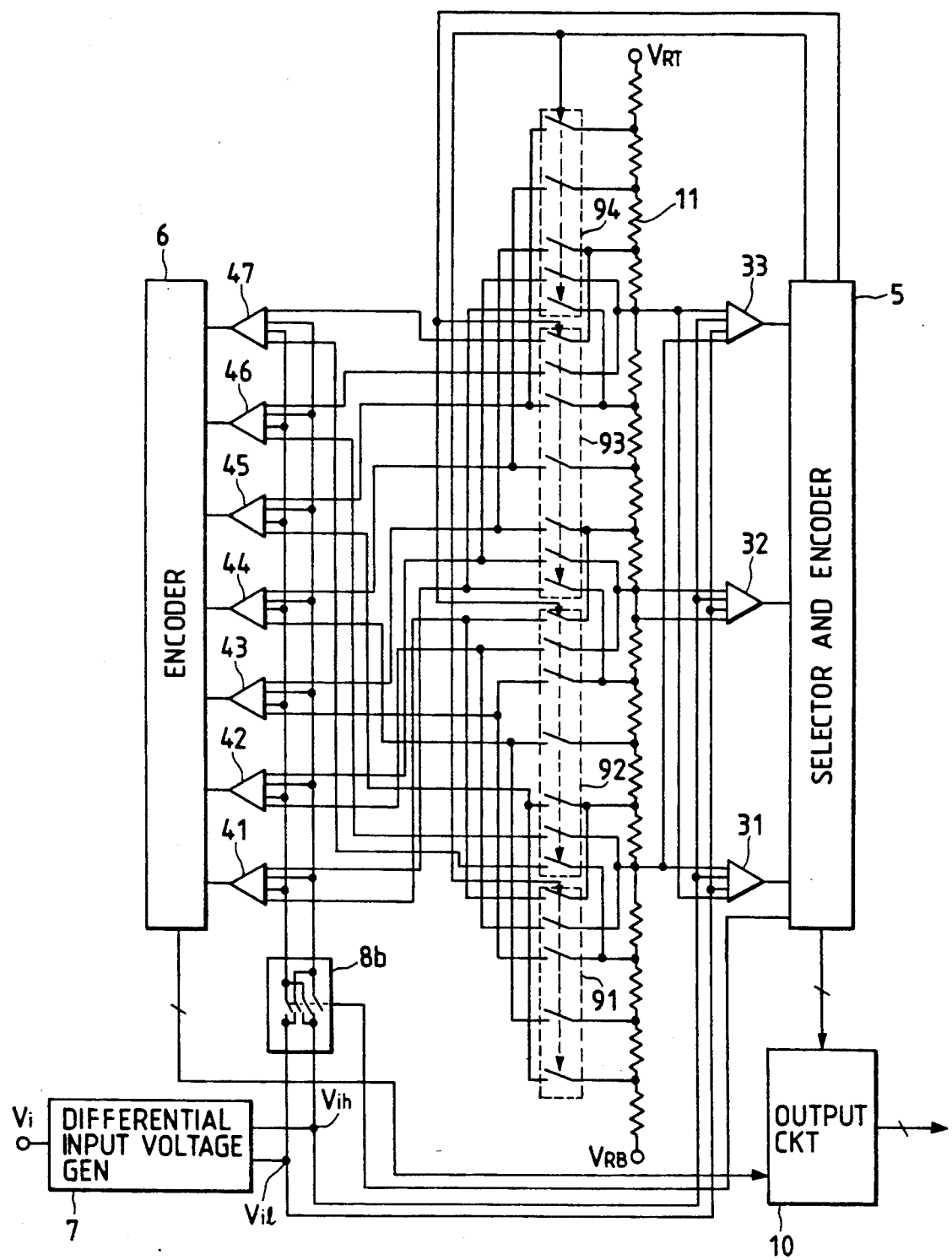

FIG. 7 is also a circuit structure diagram which shows an embodiment of the present invention, and uses one differential input voltage interchanging switch 8b instead of seven reference voltage interchanging switches 81-87 that were installed in the embodiment in FIG. 1.

Figure 8:
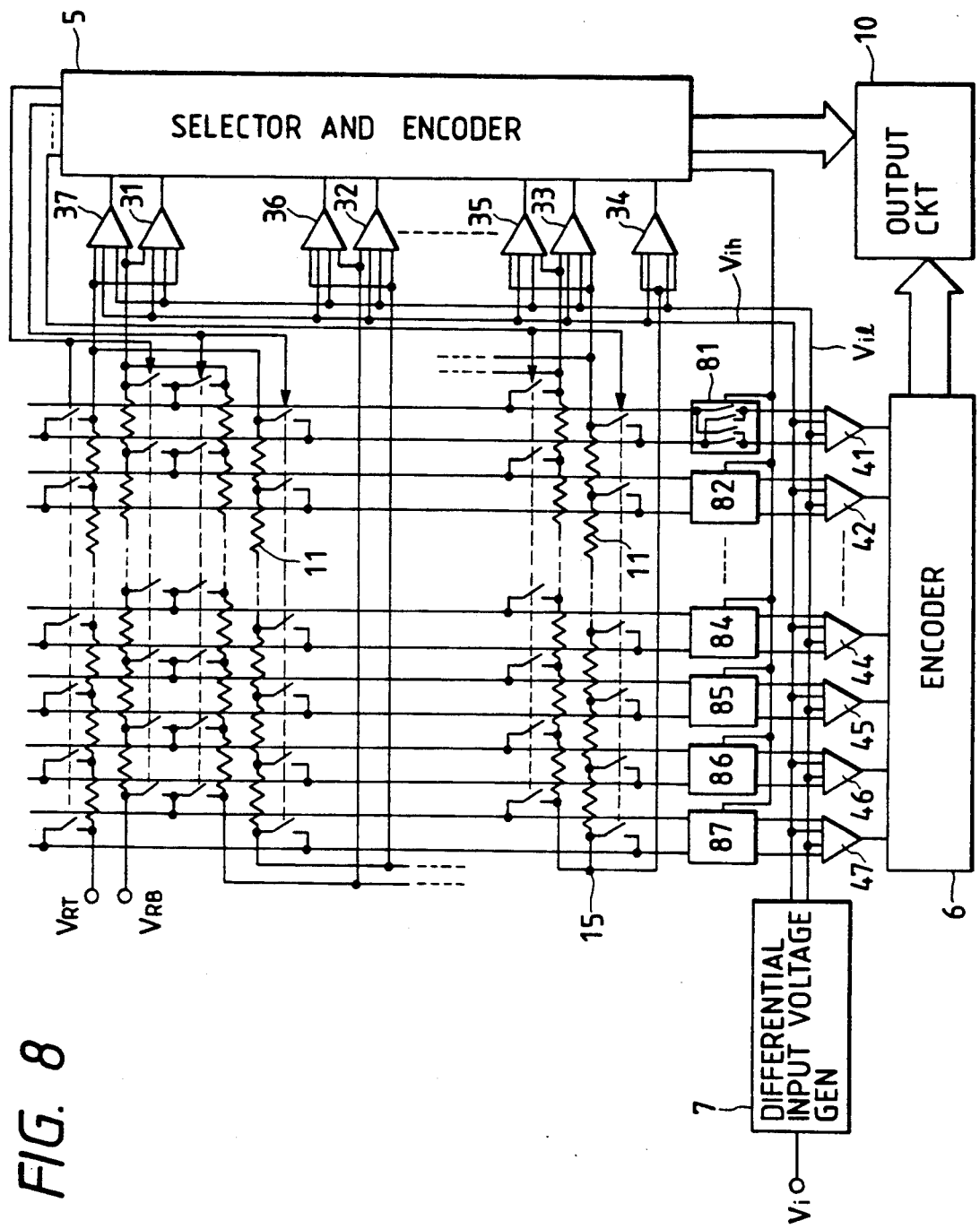

FIG. 8 is a structural diagram which presents yet another embodiment of the present invention. In this embodiment, the resistor-string 11 of the embodiment shown in FIG. 1 has been changed to have a structure in which first and second resistor-strings are arranged in parallel with one end 15 connected to each other and the other end connected to constant voltage sources $V_{RT}$ and $V_{RB}$, respectively. Moreover, the middle section of these resistor-strings are extended by connection wiring, bent and placed in a zigzag configuration. This will facilitate extending of wiring for partial voltages, which are reference voltages from resistor-string 11, to fully-differential voltage comparators for lower bits 41-47 as well as arrangement of interchanging switches 81-87. By using this structure in FIG. 8, the circuit scale of A/D converter in the present invention can be further reduced when an integrated circuit is introduced. Further, the embodiment in FIG. 8 shows a case where overlap of reference voltage group for fully-differential voltage comparators for lower bits 41-47 is equivalent to 1 LSB.

According to the present invention, a half-flash A/D converter which is less affected by influence from power noise, has high precision and a small circuit scale and is suited for introduction of integrated circuit can be realized.

According to the present invention, the circuit scale can be further reduced by omitting fully-differential voltage comparators for upper bits.

According to the present invention, there is an advantage of further reducing circuit scale by substituting reference voltage interchange switches that were installed on each fully-differential voltage comparator for lower bits and voltage comparator for upper bit correction signal with one differential input voltage interchanging switch.

According to the present invention, a higher precision A/D converter can be realized by correcting upper bit digital values obtained from voltage comparators for upper bits. According to the present invention, there is an effect of further reducing the circuit scale for A/D converters with integrated circuit.

We claim:
1. An analog-to-digital converter comprising:
a resistor-string comprised of a plurality of serially-connected resistors, both ends of said resistor-string being respectively connected to voltage sources with different predetermined voltages, said resistor-string generating a plurality of partial voltages at positions where said resistor-string is divided into a plurality of sets in the manner that the same predetermined number of resistors are included in each set, as a plurality of reference volt- ages for upper bits, each of the divided sets generating a plurality of partial voltages on resistors in said each of sets as a plurality of reference voltages for lower bits;

means for generating a first differential input voltage which increases in proportion to the increase in an analog input voltage to be converted into digital value, and a second differential input voltage which decreases in inverse proportion to the increase in the analog input voltage;

at least one voltage comparator for upper bits which compares a differential voltage between two reference voltages for upper bits with a differential voltage between the first and second differential input voltages;

means for obtaining upper bit digital value from the result of comparison by said voltage comparator for upper bits;

means for selecting two sets from said divided sets according to the obtained upper bit digital value;

at least one voltage comparator for lower bits, said voltage comparator for lower bits having a pair of reference voltage input terminals and a pair of signal input terminals, one of the reference voltages for lower bits generated in one of the selected two sets and one of the reference voltages for lower bits generated in the other set being supplied to said pair of reference voltage input terminals as first and second reference voltages for lower bits, respectively, the first and second differential input voltages being supplied to said pair of signal input terminals, respectively, so that said voltage comparator for lower bits compares a differential voltage between said first and second reference voltages for lower bits with a differential voltage between said first and second differential input voltages;

switching means for interchanging said first and second reference voltages for lower bits that are supplied to said pair of reference voltage input terminals of said voltage comparator for lower bits with each other according to the obtained upper bit digital value;

means for obtaining lower bit digital value from the result of comparison by said voltage comparator for lower bits; and means for obtaining digital value corresponding to the analog input voltage from the upper bit digital value and the lower bit digital value that have been obtained.

2. An analog-to-digital converter according to claim 1 wherein said analog-to-digital converter further comprises at least one additional voltage comparator which generates information for correcting the upper bit digital value, said at least one additional voltage comparator having a pair of reference voltage input terminals and a pair of signal input terminals, reference voltages neighboring said first and second reference voltages for lower bits that are supplied to said pair of reference voltage input terminals of said voltage comparator for lower bits being supplied to the pair of reference voltage input terminals of said additional voltage comparator, said first and second differential input voltages being supplied to the pair of signal input terminals of said additional voltage comparator, so that the information for correcting the upper bit digital value is generated as an output of comparison result of said at least one additional voltage comparator.

3. An analog-to-digital converter according to claim 1 wherein said resistor-string is comprised of first and second resistor-strings that are serially connected with each other, said first and second resistor-strings being returned at their connecting point to become parallel and then bent in a zigzag shape.

4. An analog-to-digital converter comprising:

a resistor-string comprised of a plurality of serially-connected resistors, both ends of said resistor-string being respectively connected to voltage sources that have different predetermined voltages, said resistor-string generating a plurality of partial voltages at positions where said resistor-string is divided into a plurality of sets in the manner that the same predetermined number of resistors are included in each set, as a plurality of reference voltages for upper bits, each of the divided sets generating a plurality of partial voltages on resistors in said each of sets as a plurality of reference voltages for lower bits;

means for generating a first differential input voltage which increases in proportion to the increase in an analog input voltage to be converted into digital value, and a second differential input voltage which decreases in inverse proportion to the increase in the analog input voltage;

at least one voltage comparator for upper bits which compares a differential voltage between two reference voltages for upper bits with a differential voltage between the first and second differential input voltages;

means for obtaining upper bit digital value from the result of comparison by said voltage comparator for upper bits;

means for selecting two sets from said divided sets according to the obtained upper bit digital value;

at least one voltage comparator for lower bits, said voltage comparator for lower bits having a pair of reference voltage input terminals and a pair of signal input terminals, one of the reference voltages for lower bits generated in one of the selected two sets and one of the reference voltages for lower bits generated in the other set being supplied to said pair of reference voltage input terminals as first and second reference voltages for lower bits, respectively, the first and second differential input voltages being supplied to said pair of signal input terminals, respectively, so that said voltage comparator for lower bits compares a differential voltage between said first and second reference voltages for lower bits with a differential voltage between said first and second differential input voltages;

switching means for interchanging said first and second differential input voltages that are supplied to said pair of signal input terminals of said voltage comparator for lower bits according to the obtained upper bit digital value;

means for obtaining lower bit digital value from the result of comparison by said voltage comparator for lower bits; and means for obtaining digital value corresponding to the analog input voltage from the upper bit digital value and the lower bit digital value that have been obtained.

5. An analog-to-digital converter according to claim 4 wherein said analog-to-digital converter further comprises at least one additional voltage comparator which generates information for correcting the upper bit digital value, said at least one additional voltage comparator having a pair of reference voltage input terminals and a pair of signal input terminals, reference voltages neighboring said first and second reference voltages for lower bits that are supplied to said pair of reference voltage input terminals of said voltage comparator for lower bits being supplied to the pair of reference voltage input terminals of said additional voltage comparator, said first and second differential input voltages being supplied to the pair of signal input terminals of said additional voltage comparator, so that the information for correcting the upper bit digital value is generated as an output of comparison result of said at least one additional voltage comparator.

6. An analog-to-digital converter according to claim 4 wherein said resistor-string is comprised of first and second resistor-strings that are serially connected with each other, said first and second resistor-strings being returned at their connecting point to become parallel and then bent in a zigzag shape.

7. An analog-to-digital converter comprising:
a resistor-string comprised of a plurality of serially-connected resistors, both ends of said resistor-string being respectively connected to voltage sources that have different predetermined voltages, said resistor-string generating a plurality of partial voltages at positions where said resistor-string is divided into a plurality of sets in the manner that the same predetermined number of resistors are included in each set, as a plurality of reference voltages for upper bits, each of the divided sets generating a plurality of partial voltages on resistors in said each of sets as a plurality of reference voltages for lower bits;
means for generating a first differential input voltage which increases in proportion to the increase in an analog input voltage to be converted into digital value, and a second differential input voltage which decreases in inverse proportion to the increase in the analog input voltage;
a plurality of voltage comparators each of which has a pair of reference voltage input terminals and a pair of signal input terminals;
switching means which causes at least one of said voltage comparators to operate as voltage comparator for upper bits, said switching means supplying two reference voltages for upper bits to the pair of reference voltage input terminals of said at least one of the voltage comparators and supplying the first and second differential input voltages to the pair of signal input terminals of said at least one of the voltage comparators, so that said at least one of voltage comparators compares a differential voltage between the two reference voltages for upper bits with a differential voltage between the first and second differential input voltages;
means for obtaining upper bit digital value from the result of comparison by said at least one of voltage comparators that has been caused to operate as voltage comparator for upper bits;
means for selecting two sets from said divided sets according to the obtained upper bit digital value;
circuit means which operates said voltage comparators as voltage comparators for lower bits, said circuit means supplying one of the reference voltages for lower bits generated in one of the selected two sets and one of the reference voltages for lower bits generated in the other set to said pair of reference voltage input terminals of said each of voltage comparators as the first and second reference voltages for lower bits, respectively, and supplying the first and second differential input voltages to said pair of signal input terminals of said each of voltage comparators, respectively, so that said each of the voltage comparators compares a differential voltage between said first and second reference voltages for lower bits with a differential voltage between said first and second differential input voltages;
switching means for interchanging said first and second reference voltages for lower bits that are supplied to said pair of reference voltage input terminals of said each of the voltage comparators according to the obtained upper bit digital value;
means for obtaining lower bit digital value from the result of comparison by said voltage comparators which operated for the lower bits; and
means for obtaining digital value corresponding to the analog input voltage from the upper bit digital value and the lower bit digital value that have been obtained.

8. An analog-to-digital converter according to claim 7 wherein said analog-to-digital converter further comprises at least one additional voltage comparator which generates information for correcting the upper bit digital value, said at least one additional voltage comparator having a pair of reference voltage input terminals and a pair of signal input terminals, reference voltages neighboring said first and second reference voltages for lower bits that are supplied to a pair of reference voltage input terminals of at least one of said voltage comparators being supplied to the pair of reference voltage input terminals of said additional voltage comparator, said first and second differential input voltages being supplied to the pair of signal input terminals of said additional voltage comparator, so that the information for correcting the upper bit digital value is generated as an output of comparison result of said at least one additional voltage comparator.

9. An analog-to-digital converter according to claim 7 wherein said resistor-string is comprised of first and second resistor-strings that are serially connected with each other, said first and second resistor-strings being returned at their connecting point to become parallel and then bent in a zigzag shape.

10. An analog-to-digital converter comprising:
a resistor-string comprised of a plurality of serially-connected resistors, both ends of said resistor-string being respectively connected to voltage sources that have different predetermined voltages, said resistor-string generating a plurality of partial voltages at positions where said resistor-string is divided into a plurality of sets in the manner that the same predetermined number of resistors are included in each set, as a plurality of reference voltages for upper bits, each of the divided sets generating a plurality of partial voltages on resistors in said each of sets as a plurality of reference voltages for lower bits;
means for generating a first differential input voltage which increases in proportion to the increase in an analog input voltage to be converted into digital value, and a second differential input voltage which decreases in inverse proportion to the increase in the analog input voltage;

a plurality of voltage comparators, each of which has a pair of reference voltage input terminals and a pair of signal input terminals;

switching means which causes at least one of said voltage comparators to operate as voltage comparator for upper bits, said switching means supplying two reference voltages for upper bits to the pair of reference voltage input terminals of said at least one of the voltage comparators and supplying the first and second differential input voltages to the pair of signal input terminals of said at least one of the voltage comparators, so that said at least one of voltage comparators compares a differential voltage between the two reference voltages for upper bits with a differential voltage between the first and second differential input voltages;

means for obtaining the upper bit digital value from the result of comparison by said at least one of voltage comparators that has been caused to operate as voltage comparator for upper bits;

means for selecting two sets from said divided sets according to the obtained upper bit digital value;

circuit means which operates said voltage comparators as voltage comparator for lower bits, said circuit means supplying one of the reference voltages for lower bits generated in one of the selected two sets and one of the reference voltage for lower bits generated in the other set to said pair of reference voltage input terminals of said each of voltage comparators as the first and second reference voltages for lower bits, respectively, and supplying the first and second differential input voltages to said pair of signal input terminals of said each of voltage comparators, respectively, so that said each of the voltage comparators compares a differential voltage between said first and second reference voltages for lower bits with a differential voltage between said first and second differential input voltages;

switching means for interchanging said first and second differential input voltages that are supplied to said pair of signal input terminals of said each of the voltage comparators according to the obtained upper bit digital value;

means for obtaining lower bit digital value from the result of comparison by said voltage comparators which operated for the lower bits; and means for obtaining digital value corresponding to the analog input voltage from the upper bit digital value and the lower bit digital value that have been obtained.

11. An analog-to-digital converter according to claim 10 wherein said analog-to-digital converter further comprises at least one additional voltage comparator which generates information for correcting the upper bit digital value, said at least one additional voltage comparator having a pair of reference voltage input terminals and a pair of signal input terminals, reference voltages neighboring said first and second reference voltages for lower bits that are supplied to a pair of reference voltage input terminals of at least one of said voltage comparators being supplied to the pair of reference voltage input terminals of said additional voltage comparator, said first and second differential input voltages being supplied to the pair of signal input terminals of said additional voltage comparator, so that the information for correcting the upper bit digital value is generated as an output of comparison result of said at least one additional voltage comparator.

12. An analog-to-digital converter according to claim 10 wherein said resistor-string is comprised of first and second resistor-strings that are serially connected with each other, said first and second resistor-strings being returned at their connecting point to become parallel and then bent in a zigzag shape.

* * * * *